(12) United States Patent
Peh et al.

(10) Patent No.: US 10,325,790 B2
(45) Date of Patent: Jun. 18, 2019

(54) METHODS AND APPARATUS FOR CORRECTING SUBSTRATE DEFORMITY

(71) Applicant: APPLIED MATERIALS, INC., Santa Clara, CA (US)

(72) Inventors: Eng Sheng Peh, Singapore (SG); Sriskantharajah Thirunavukarasu, Singapore (SG); Jun-Liang Su, Singapore (SG); Shoju Vayyapron, Bangalore (IN); Karthik Elumalai, Bangalore (IN); Dimantha Rajapaksa, Ragama (LK); Arunkumar M Tatti, Haveri (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 5 days.

(21) Appl. No.: 15/811,575

(22) Filed: Nov. 13, 2017

(65) Prior Publication Data

US 2018/0218928 A1    Aug. 2, 2018

Related U.S. Application Data

(63) Continuation-in-part of application No. 15/142,220, filed on Apr. 29, 2016, now Pat. No. 9,818,624.

(51) Int. Cl.
*H01L 21/00* (2006.01)
*H01L 21/67* (2006.01)
(Continued)

(52) U.S. Cl.
CPC .. *H01L 21/67115* (2013.01); *H01L 21/67017* (2013.01); *H01L 21/6838* (2013.01);
(Continued)

(58) Field of Classification Search
CPC ......... H01L 21/67115; H01L 21/67017; H01L 21/6838; H01L 21/68742; H01L 21/68757; H05B 3/0047
(Continued)

(56) References Cited

U.S. PATENT DOCUMENTS

| 5,856,906 A | * | 1/1999 | Kholodenko ..... H01L 21/67109 279/128 |
| 2003/0080112 A1 | | 5/2003 | Van Bilsen |

(Continued)

FOREIGN PATENT DOCUMENTS

| JP | 2014-150288 A | 8/2014 |
| JP | 2015-035584 A | 2/2015 |
| KR | 10-2013-0076753 A | 7/2013 |

OTHER PUBLICATIONS

International Search Report and Written Opinion dated Jul. 28, 2016 for PCT Application No. PCT/US2016/030079.

*Primary Examiner* — Calvin Y Choi
(74) *Attorney, Agent, or Firm* — Moser Taboada; Alan Taboada

(57) ABSTRACT

Embodiments of methods and apparatus for correcting substrate deformity are provided herein. In some embodiments, a substrate support includes a base having an interior volume formed by walls extending upward from the base; a plurality of infrared lamps disposed within the interior volume; a support plate disposed above the plurality of infrared lamps, wherein the support plate includes a support surface to support a substrate; and a cover plate disposed atop the support plate and having a central opening corresponding to the support surface and an exhaust portion at a periphery of a top surface of the cover plate, wherein the exhaust portion includes a plurality of perforations fluidly coupling a space above the cover plate with an exhaust conduit formed in the cover plate. Embodiments of a showerhead assembly and (Continued)

processing equipment incorporating the inventive substrate support and showerhead assembly are additionally provided herein.

20 Claims, 8 Drawing Sheets

(51) Int. Cl.
    *H05B 3/00*         (2006.01)
    *H01L 21/687*     (2006.01)
    *H01L 21/683*     (2006.01)
(52) U.S. Cl.
    CPC .. *H01L 21/68742* (2013.01); *H01L 21/68757* (2013.01); *H05B 3/0047* (2013.01)
(58) Field of Classification Search
    USPC ........................................................ 438/799
    See application file for complete search history.

(56) References Cited

U.S. PATENT DOCUMENTS

| | | | |
|---|---|---|---|
| 2008/0138917 A1* | 6/2008 | Verhaverbeke | G03F 7/16 438/16 |
| 2014/0053866 A1* | 2/2014 | Baluja | C11D 11/0041 134/1.1 |
| 2014/0103806 A1 | 4/2014 | Kellogg et al. | |
| 2014/0283750 A1* | 9/2014 | Okada | C23C 16/4584 118/730 |
| 2015/0001282 A1 | 1/2015 | Abe | |

* cited by examiner

METHODS AND APPARATUS FOR CORRECTING SUBSTRATE DEFORMITY

CROSS-REFERENCE TO RELATED APPLICATIONS

This application is a continuation in part of U.S. patent application Ser. No. 15/142,220, filed Apr. 29, 2016, entitled, "Method and Apparatus for Correcting Substrate Deformity," which is herein incorporated by reference in its entirety.

FIELD

Embodiments of the present disclosure generally relate to correcting deformities in a substrate.

BACKGROUND

Epoxy mold compounds are used to encapsulate dies in substrate packaging. These compounds bow and warp after thermal processes due to inhomogeneous heating and cooling, causing non-uniform expansion/contraction rates in current process equipment. Conventional thermal processes utilize directional heat transfer via radiative, convective or conductive thermal processes. The directionality results in anisotropic expansion and contraction rates. When operated near the thermoplastic regime, non-uniform cooling and, subsequently, contraction rates give rise to a warped substrate. Such warp and bow effects are frequently observed and imply that the substrate is being processed close to the thermoplastic regime of the substrate, giving rise to warpage beyond acceptable levels.

Therefore, the inventors have provided embodiments of methods and apparatus for correcting substrate deformity.

SUMMARY

Methods and apparatus for correcting substrate deformities are provided herein. In some embodiments, a substrate support includes a base having an interior volume formed by walls extending upward from the base, wherein the walls are disposed within a periphery of the base; a plurality of infrared lamps disposed within the interior volume; a support plate disposed above the plurality of infrared lamps, wherein the support plate includes a support surface to support a substrate; and a cover plate disposed atop the support plate and having a central opening corresponding to the support surface and an exhaust portion at a periphery of a top surface of the cover plate, wherein the exhaust portion includes a plurality of perforations fluidly coupling a space above the cover plate with an exhaust conduit formed in the cover plate.

In some embodiments, a showerhead assembly includes an upper plate having a gas inlet and an interior volume formed by walls extending downward from the upper plate, wherein the walls are disposed within a periphery of the upper plate; a plurality of infrared lamps disposed within the interior volume; a holding plate disposed below the plurality of infrared lamps to support the plurality of infrared lamps within the interior volume; a blocker plate having a plurality of apertures and disposed below the holding plate, wherein the blocker plate includes a recessed section which, together with the holding plate, forms a plenum, and wherein the plurality of apertures are disposed in the recessed section; a gas conduit extending from the gas inlet and through the holding plate to supply gas to the plenum; and a cover plate disposed below the blocker plate and having a central opening corresponding to the recessed section, wherein the cover plate is coupled to a top of the walls of the upper plate to couple the holding plate and the blocker plate to the upper plate.

In some embodiments, a processing chamber includes a chamber body having a processing volume; a substrate support disposed in a lower portion of the processing volume; and a showerhead assembly disposed in an upper portion of the processing volume opposite the substrate support. The substrate support includes a base having a first interior volume formed by first walls extending upward from the base, wherein the first walls are disposed within a periphery of the base; a first plurality of infrared lamps disposed within the first interior volume; a support plate disposed above the first plurality of infrared lamps, wherein the support plate includes a support surface to support a substrate; and a first cover plate disposed atop the support plate and having a first central opening corresponding to the support surface and an exhaust portion at a periphery of a top surface of the first cover plate, wherein the exhaust portion includes a plurality of perforations fluidly coupling the processing volume with an exhaust conduit formed in the first cover plate. The showerhead assembly includes an upper plate having a gas inlet and a second interior volume formed by second walls extending downward from the upper plate, wherein the second walls are disposed within a periphery of the upper plate; a second plurality of infrared lamps disposed within the second interior volume; a holding plate disposed below the second plurality of infrared lamps to support the second plurality of infrared lamps within the second interior volume; a blocker plate having a plurality of apertures and disposed below the holding plate, wherein the blocker plate includes a recessed section which, together with the holding plate, forms a plenum, and wherein the plurality of apertures are disposed in the recessed section; a gas conduit extending from the gas inlet and through the holding plate to supply gas to the plenum; and a second cover plate disposed below the blocker plate and having a second central opening corresponding to the recessed section, wherein the second cover plate is coupled to a top of the second walls of the upper plate to couple the holding plate and the blocker plate to the upper plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
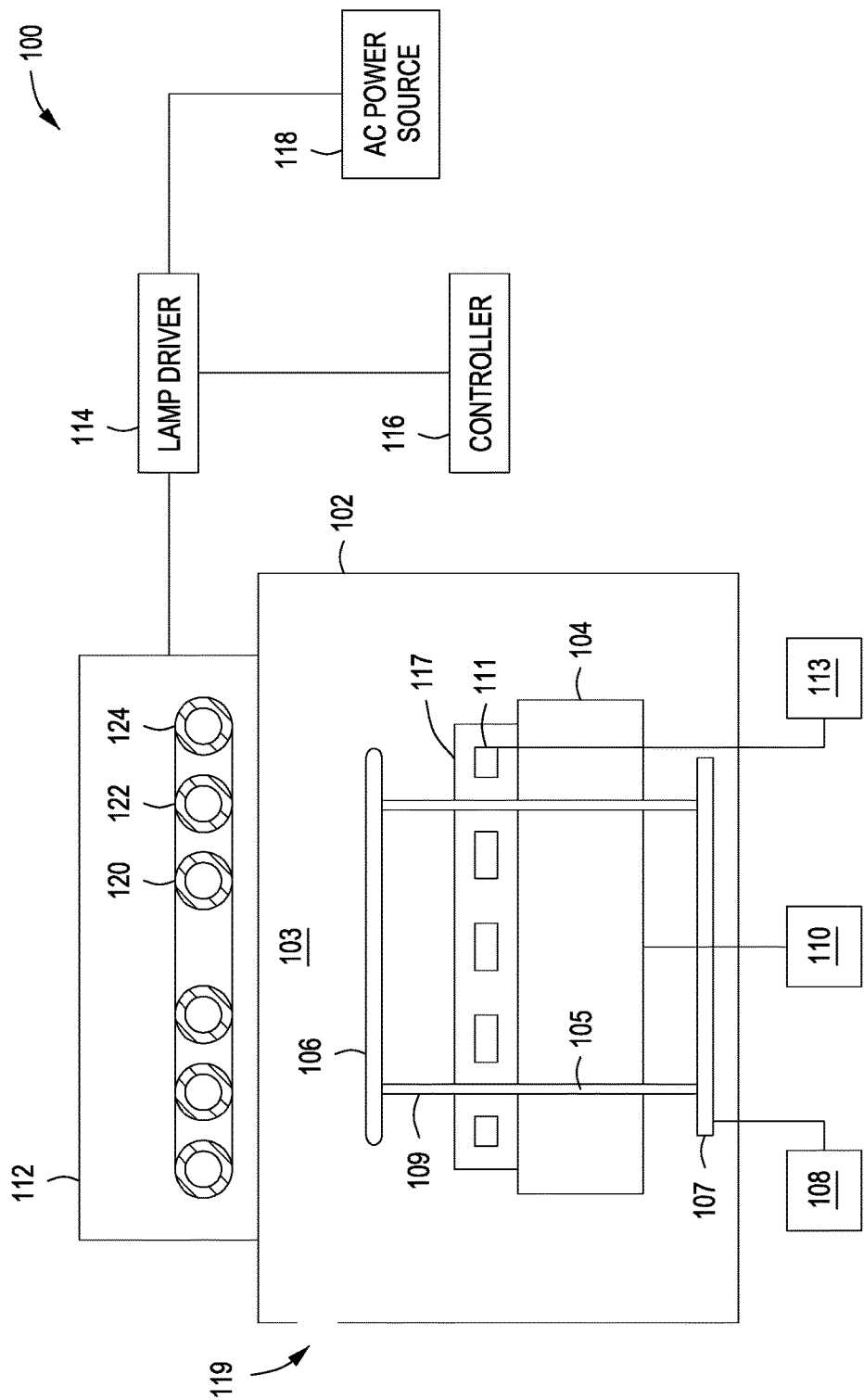
FIG. 1 depicts a block diagram of a substrate processing system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method and apparatus for correcting substrate deformity are provided herein. The method and apparatus may advantageously planarize a substrate that has bowed or warped due to heating and/or cooling of a substrate during previous processing, in particular substrates having epoxy coatings.

FIG. 1 depicts a block diagram of a substrate processing system 100 suitable for performing the inventive method in accordance with some embodiments of the present disclosure in accordance with embodiments of the present disclosure. As depicted in FIG. 1, the substrate processing system 100 comprises a chamber 102 enclosing a processing volume 103, a support 104 for supporting a substrate 106, a lift pin assembly 107, a vacuum source 110, a heat transfer supply 113, a radiative heat source (lamp array 112), lamp driver 114, controller 116, and an AC power source 118. One or more temperature sensors and associated hardware (not shown) may be provided and coupled to the controller for controlling the temperature within the processing volume 103. The substrate 106 is, for example, a semiconductor wafer. The substrate 106 may comprise an epoxy coating disposed thereon.

The lift pin assembly 107 includes a plurality of lift pins 109 that extend through a corresponding plurality of lift pin channels 105 formed in the support 104. The lift pin assembly 107 may be raised and lowered by a driving mechanism 108 (such as a motor or actuator) to raise and lower the substrate 106 onto or off of a support surface 117 of the support 104. The chamber 102 may further include an opening 119 through which a robotic arm (not shown) extends to insert/remove the substrate 106 onto/from the plurality of lift pins 109. The lift pin assembly 107 is moveable between a first position, in which the substrate is proximate the lamp array 112, and a second position, in which the substrate 106 rests on the support surface 117. In some embodiments, the substrate 106 is heated to first predetermined temperature in the first position and cooled to second predetermined temperature in the second position.

In some embodiments, the support 104 is a vacuum chuck to which the vacuum source 110 is coupled to chuck the substrate 106 onto the support surface 117. In some embodiments, the support 104 may alternatively be an electrostatic chuck. The support 104 includes a plurality of heat transfer channels 111 fluidly coupled to a heat transfer supply 113. In some embodiments, for example, the heat transfer supply 113 may provide a coolant to the heat transfer channels 111 to cool the substrate 106 placed atop the support surface 117 of the support 104.

The AC power source 118 delivers AC power to the lamp driver 114, the operation of which is controlled by the controller 116. The lamp driver 114 distributes power to the lamp array 112. In turn, the lamp array 112 produces heat to thermally treat the substrate 106 within the chamber 102.

In some embodiments, the lamp array 112 comprises one or more lamps, each of which may be individually controlled by the controller 116 through the lamp driver 114. As illustrated in FIG. 1, three lamps (120, 122, 124) are shown, although a lesser number or a greater number of lamps may be used. Each lamp 120, 122, 124 may be individually controlled by the controller 116 to provide heat to corresponding heating zones. Because the lamps may be individually controlled, the temperature in the heating zones may also be controlled.

Figure 2:
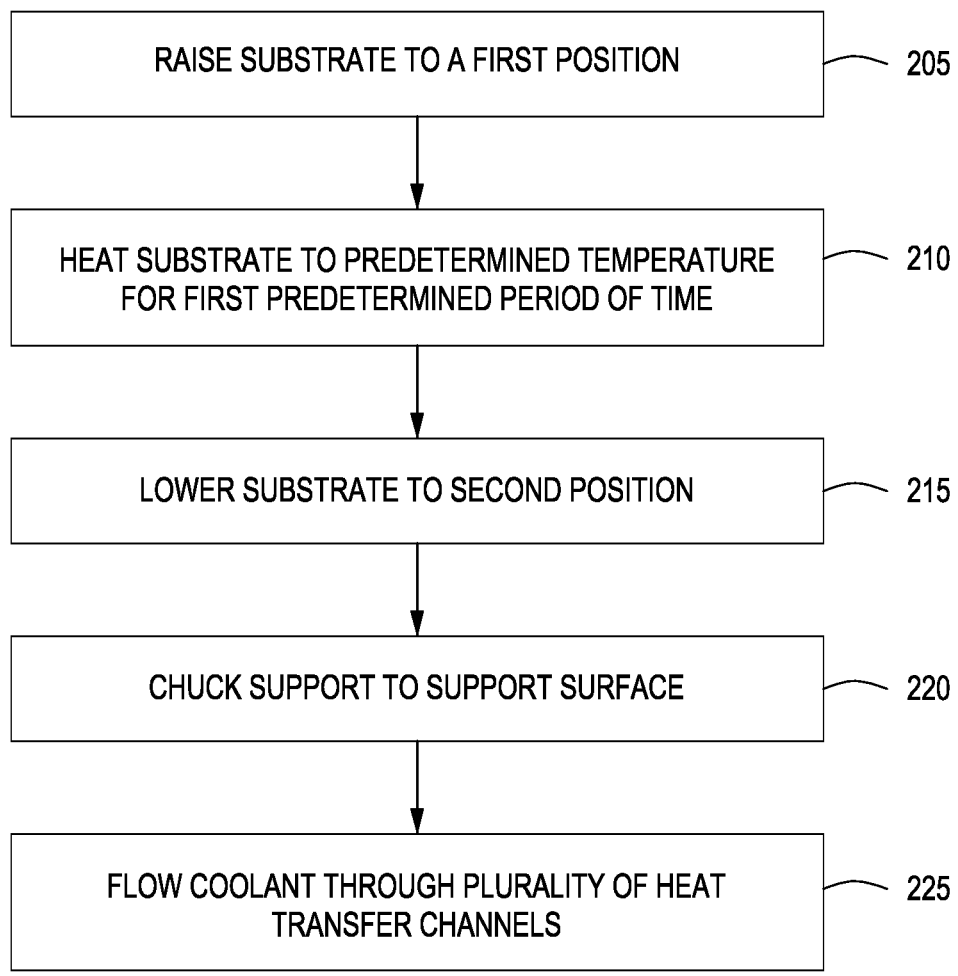
FIG. 2 shows a flow chart illustrating a method for correcting substrate deformity in accordance with some embodiments of the present disclosure.

FIG. 2 is a flowchart illustrating a method 200 for correcting substrate deformity in accordance with some embodiments of the present disclosure. At 205, the substrate 106 that is deformed (i.e., warped, bowed, etc.) is raised to a first position proximate the lamp array 112 by the lift pin assembly 107. At 210, the substrate 106 is heated to a predetermined temperature for a first predetermined period of time. The predetermined temperature may be at or above a glass transition temperature of an epoxy disposed on the substrate (for substrates having an epoxy coating). For example, the substrate 106 may be heated to a temperature of about 180° C. to about 220° C. for a duration of about 30 seconds to 60 seconds. At 215, the substrate 106 is lowered to a second position onto the support surface 117. At 220, the substrate 106 is chucked to the support surface 117 to planarize the deformed substrate. At 225, a coolant is flowed through the heat transfer channels 111 for a second predetermined period of time to cool the substrate 106 and retain the planarized shape of the substrate 106. The substrate 106 is cooled to a temperature at least below the glass transition temperature for an epoxy coating on the substrate, such as at or below about 130° C. In some embodiments, the second predetermined period of time is between about 30 seconds to about 60 seconds.

Figure 3:
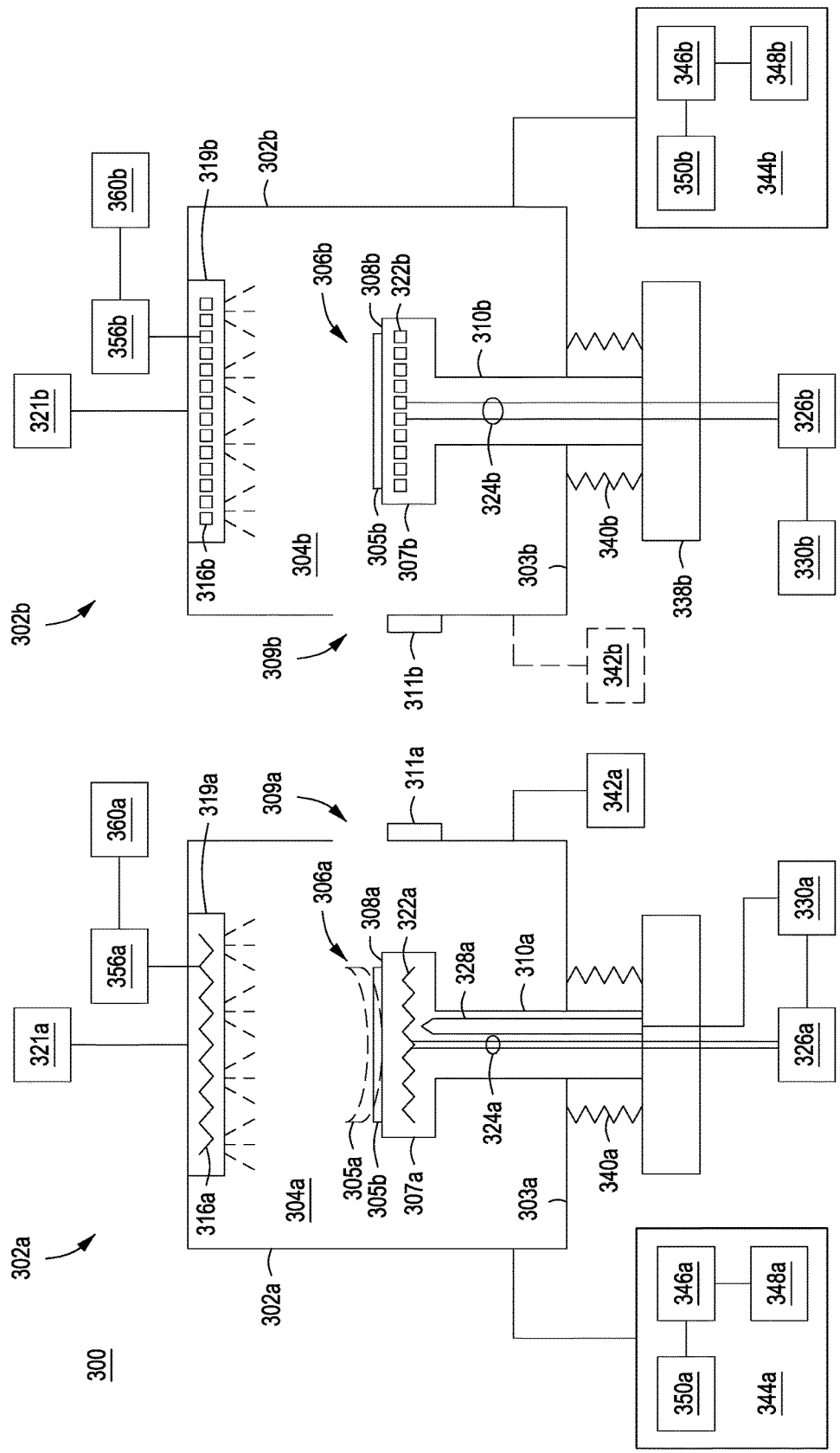
FIG. 3 depicts a block diagram of a substrate processing system in accordance with some embodiments of the present disclosure.

FIG. 3 depicts a block diagram of a substrate processing system 300 suitable for performing the inventive method in accordance with some embodiments of the present disclosure in accordance with embodiments of the present disclosure. For example, a substrate processing system 300 includes a first process chamber 302a (i.e., a heating chamber) having a first processing volume 304a and a first substrate support 306a disposed in a lower portion of the first processing volume 304a for supporting a substrate 305a,b. The first process chamber 302a may be an atmospheric chamber (i.e., not a vacuum chamber) or a vacuum chamber. Providing the first process chamber 302a as an atmospheric chamber advantageously reduces the cost of the system since non-vacuum chambers are less expensive to fabricate and maintain than vacuum chambers.

The first substrate support 306a may include a first body 307a having a first support surface 308a and a first shaft 310a to support the first body 307a. Although illustrated in FIG. 1 as a pedestal-type design, the substrate support may be any suitable substrate support having a support surface and a member, such as the first shaft 310a or any other suitable member for supporting the support surface. In some embodiments, the first substrate support 306a may comprise a ceramic material, such as, for example, aluminum oxide (Al$_2$O$_3$) or aluminum nitride (AlN), or a metallic material, such as, for example, aluminum (Al). The first substrate support 306a does not include a chucking mechanism such as, for example, a vacuum chuck, an electrostatic chuck, clamps, or the like. The first substrate support 306a may also include a lift pin mechanism (similar to driving mechanism 108 of lift pin assembly 107 shown in FIG. 1) having a plurality of lift pins to facilitate placement and removal of the substrate on/from the first support surface 308a.

The first substrate support 306a includes a first heater 322a disposed in the first substrate support 306a proximate the first support surface 308a to provide heat to the substrate 305a,b when disposed on the first support surface 308a. The first heater 322a may be any suitable heater used in a substrate support, such as a resistive heater or the like. The first heater 322a may include one or more conductive lines 324a that extend from the first heater 322a through the first shaft 310a to provide power to the first heater 322a. For example, as illustrated in FIG. 3, the one or more conductive lines 324a may couple the first heater 322a to a first power supply 326a disposed external of the first process chamber 302a. For example, the one or more conductive lines 324a may include a first line for providing power from the first power supply 326a to the first heater 322a and a second line for returning power to the first power supply 326a. The first power supply 326a may include an alternating current (AC) power source, a direct current (DC) power source or the like. Alternatively (not shown), the one or more conductive lines 324a may be a single conductive line, which provides power from the first power supply 326a to the first heater 322a.

The first substrate support 306a may include a thermocouple 328a disposed in the first substrate support 306a to measure a desired temperature, such as the temperature of the first substrate support 306a, the first support surface 308a, or the temperature of the substrate 305a,b when disposed on the first support surface 308a. For example, the thermocouple 328a may be any suitable thermocouple design, such as a thermocouple probe or the like. The thermocouple 328a may be removable. As illustrated in FIG. 3, the thermocouple 328a may extend along the first shaft 310a of the first substrate support 306a to proximate the first support surface 308a. The thermocouple 328a as illustrated in FIG. 3 is merely exemplary, and the tip of the thermocouple may extend to proximate the first heater 322a (as illustrated in FIG. 3) or to above the first heater 322a and proximate the first support surface 308a (not shown). The location of the tip of the thermocouple 328a may be adjusted relative to the first support surface 308a to provide the most accurate measurement of temperature of the substrate 305a,b or of some other component such as the first support surface 308a. The thermocouple 328a may be operatively coupled to a first temperature controller 330a. For example, the first temperature controller 330a may control the first power supply 326a based on the temperature measured by the thermocouple 328a. Alternatively, the first temperature controller 330a may be part of, or coupled to, a system controller, such as the first controller 344a that may control the operations of the first process chamber 302a.

Figure 5:
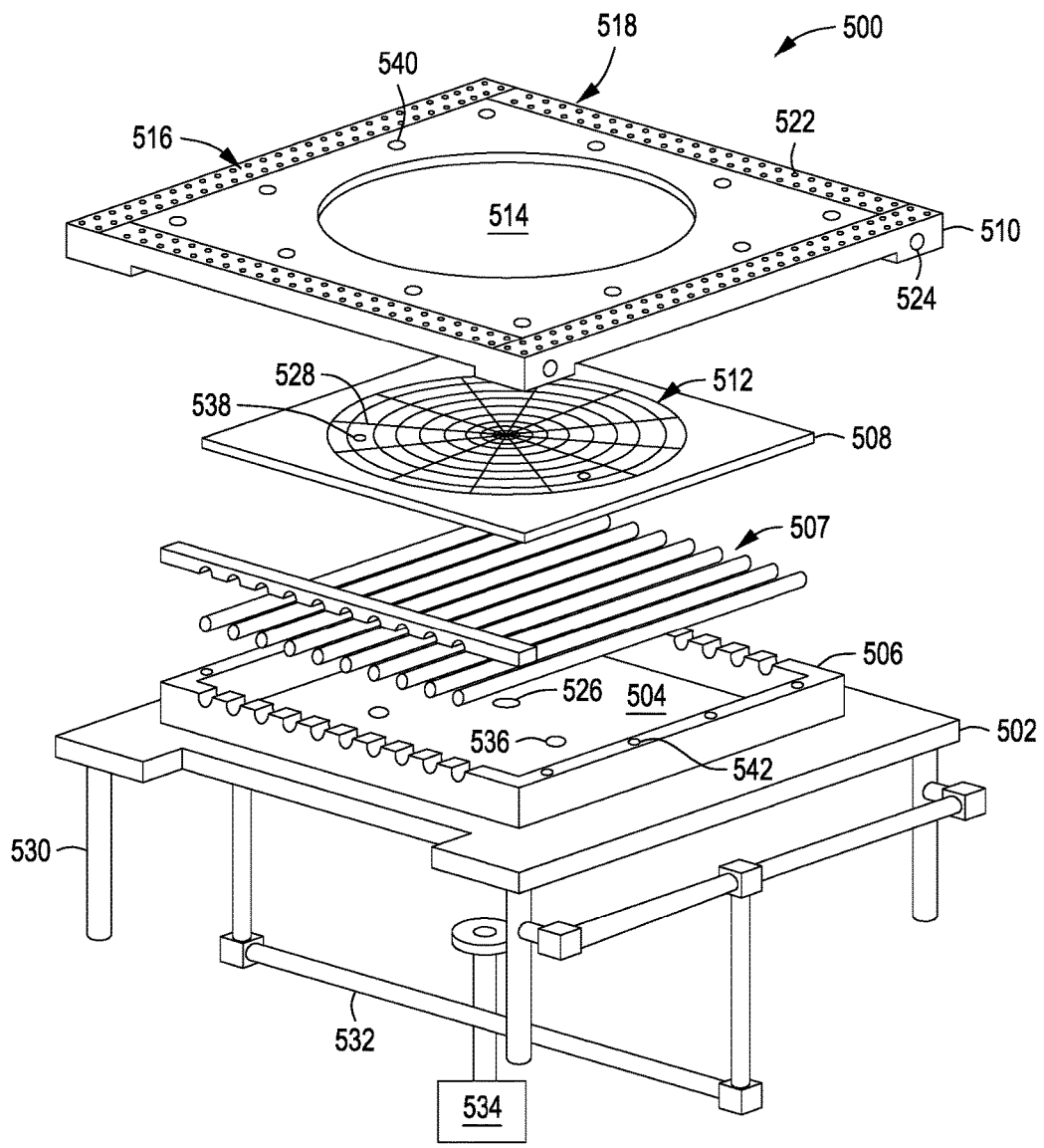
FIG. 5 depicts an exploded isometric view of a substrate support in accordance with some embodiments of the present disclosure.
Figure 6:
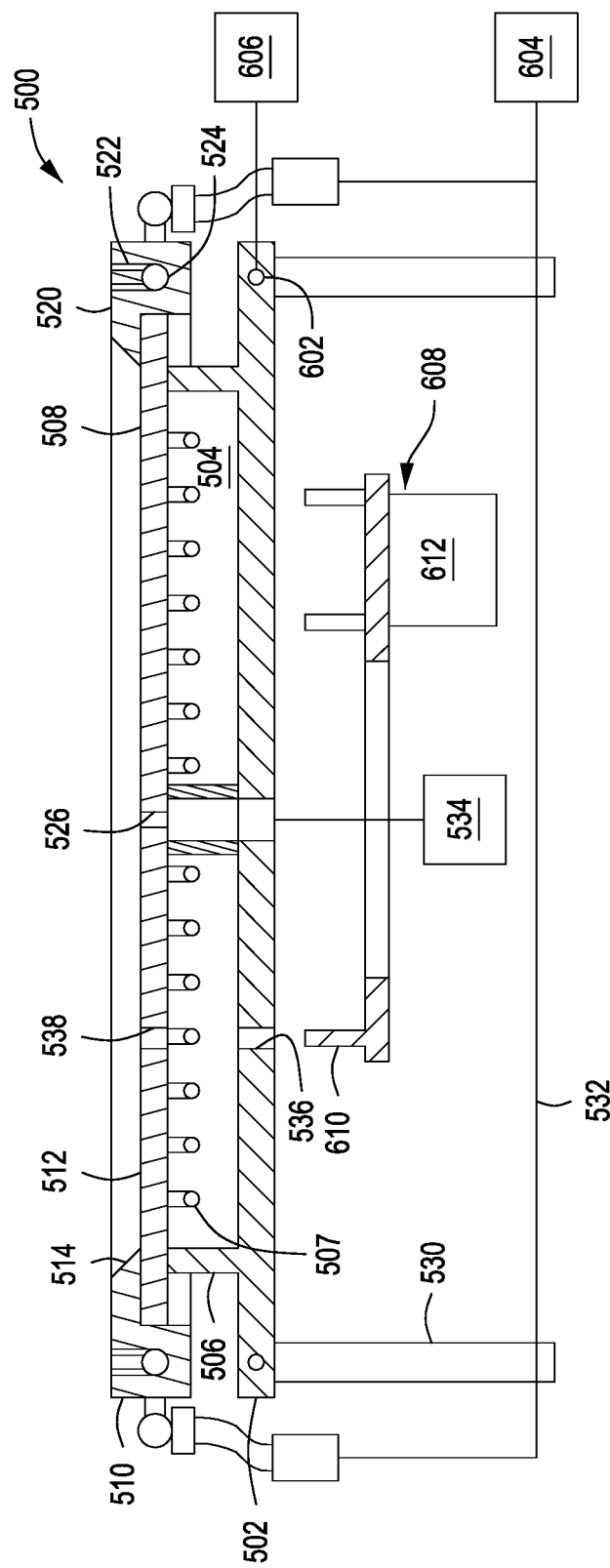
FIG. 6 depicts a cross-sectional view of a substrate support in accordance with some embodiments of the present disclosure.

In some embodiments, the first substrate support may alternatively be a vacuum chuck such as the substrate support depicted in FIGS. 5 and 6. FIGS. 5 and 6 respectively depict exploded isometric and cross-sectional views of a substrate support 500 in accordance with some embodiments of the present disclosure. In some embodiments, the substrate support 500 includes a base 502 having an interior volume 504 (first interior volume) formed by walls 506 (first walls) extending upward from the base 502. In some embodiments, the base 502 includes a coolant channel 602 (FIG. 6) formed in the base 502. In some embodiments, the coolant channel 602 may be disposed outward of the walls 506.

A plurality of infrared lamps 507 are disposed within the interior volume 504 to heat a substrate to be flattened. In some embodiments, the plurality of infrared lamps 507 includes a plurality of heating zones that may be controlled independently or in groups. In some embodiments, the plurality of heating zones includes 1-4 heating zones. Each of the plurality of infrared lamps 507 is configured to reach a temperature between about 170° C. and about 200° C. In some embodiments, each of the plurality of infrared lamps 507 has a voltage of about 110 volts and a power rating of about 350 watts. However, the plurality of infrared lamps may include lamps of other voltages and power ratings to achieve a desired result (i.e., a desired flatness control of a warped substrate). In some embodiments, the plurality of infrared lamps 507 are configured to maintain a warped substrate at a temperature between about 180° C. and about 200° C. The inventors have discovered that by using infrared lamps instead of resistive heating elements, the temperature of the substrate support 500 may advantageously be more rapidly changed as compared to resistive heating elements.

The substrate support 500 further includes a support plate 508 disposed above the plurality of infrared lamps 507 and a cover plate 510 disposed atop the support plate 508. The support plate 508 includes a support surface 512 to support a substrate atop the support plate 508. The cover plate 510 includes a central opening 514 corresponding to and exposing the support surface 512. In some embodiments, the support plate 508 includes a through hole 526 disposed proximate a center of the support plate 508 and a plurality of channels 528 extending outward from the through hole 526. The through hole 526 and the plurality of channels 528 are configured to distribute a vacuum chucking force over a bottom surface of the substrate being flattened. In some embodiments, the support plate 508 is formed of quartz.

The cover plate 510 further includes an exhaust portion 516 at a periphery 518 of a top surface 520 of the cover plate 510. The exhaust portion 516 includes a plurality of perforations 522 fluidly coupling a space above the cover plate 510 (i.e., first processing volume 304a) with an exhaust conduit 524 formed in the cover plate 510 beneath the plurality of perforations 522. In some embodiments, the cover plate 510 is formed of a thermally conductive material such as, for example, aluminum, stainless steel, or the like. In some embodiments, the cover plate 510 includes a first plurality of holes 540 through which a corresponding plurality of fixation elements (such as bolts, screws, clamps, or the like, not shown) may extend to be inserted into a corresponding second plurality of fixation holes 542 in a top surface of the walls 506 to couple the cover plate 510 to the base 502.

In some embodiments, the substrate support 500 further includes a plurality of support posts 530 to support the substrate support 500 within a chamber (e.g., first process chamber 302a). The exhaust conduit 524 is fluidly coupled to an exhaust line 532, which is coupled to a pump 604 configured to pump down the process chamber and exhaust the gases supplied through the showerhead into the processing volume. The through hole 526 is fluidly coupled to a vacuum chucking supply 534. The coolant channel 602 is fluidly coupled to a coolant supply 606 to flow a coolant through the coolant channel 602 and maintain the base 502 at a desired temperature.

In some embodiments, the substrate support 500 further includes a lift pin assembly 608 having a plurality of lift pins 610. The base 502 includes a first plurality of holes 536 corresponding to the plurality of lift pins 610. The support plate 508 similarly includes a second plurality of holes 538 corresponding to first plurality of holes 536 and aligned with the first plurality of holes 536 so that the plurality of lift pins 610 extend through the first and second plurality of holes 536, 538 when the lift pin assembly 608 is in a raised position. The lift pin assembly 608 includes a lift mechanism 612, such as a motor or actuator, configured to raise and lower the lift pin assembly 608.

Returning to FIG. 3, the first process chamber 302a further includes a first showerhead 319a disposed in an upper portion of the first processing volume 304a that is coupled to a first gas panel 321a as illustrated in FIG. 3 to provide one or more process gases to the first processing volume 304a. The one or more process gases may include one or more non-toxic inert gases such as, for example, nitrogen or argon. The first showerhead 319a is merely one exemplary chamber component for delivering one or more process gases to the first processing volume 304a. Alternatively or in combination, the one or more process gases may be delivered to the first processing volume 304a via side injection ports (not shown) disposed about the walls of the first process chamber 302a, or gas inlets disposed in other regions of the process chamber. In some embodiments, the first showerhead 319a may include a second heater 316a disposed in the first showerhead 319a proximate a substrate-facing surface of the showerhead to heat the one or more process gases flowing through the showerhead. The second heater 316a may be any suitable heater used in a showerhead, such as a resistive heater or the like. The second heater 316a is coupled to a second power supply 356a disposed external of the first process chamber 302a. The second power supply 356a may include an alternating current (AC) power source, a direct current (DC) power source or the like. The second power supply 356a may be coupled to a second temperature controller 360a to control the second power supply 356a based on the temperature measured by a thermocouple 328a, which is operatively coupled to the second power supply 356a. In some embodiments, the one or more process gases may alternatively be heated prior to entering the first showerhead 319a.

Figure 7:
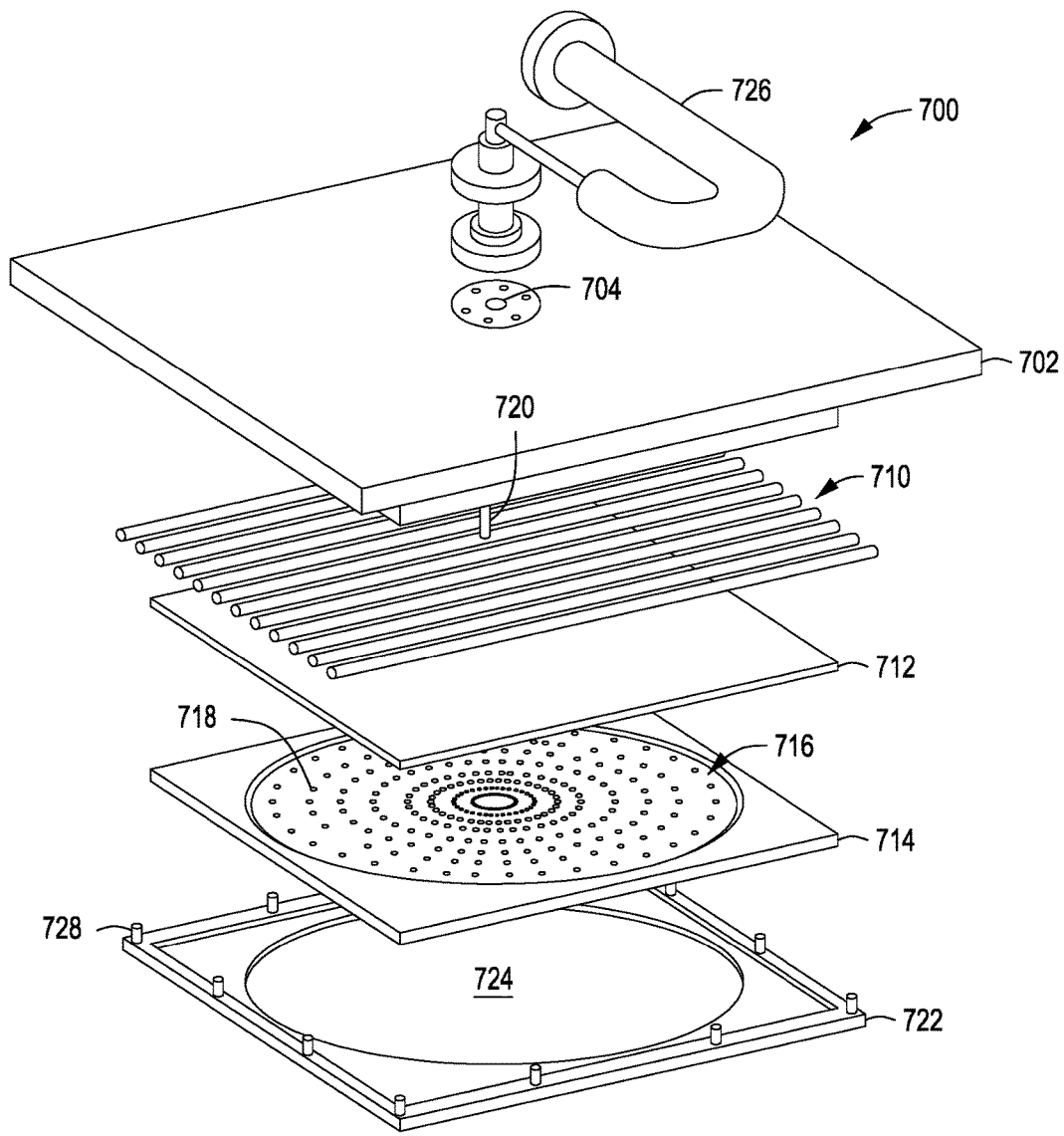
FIG. 7 depicts an exploded isometric view of a showerhead assembly in accordance with some embodiments of the present disclosure.
Figure 8:
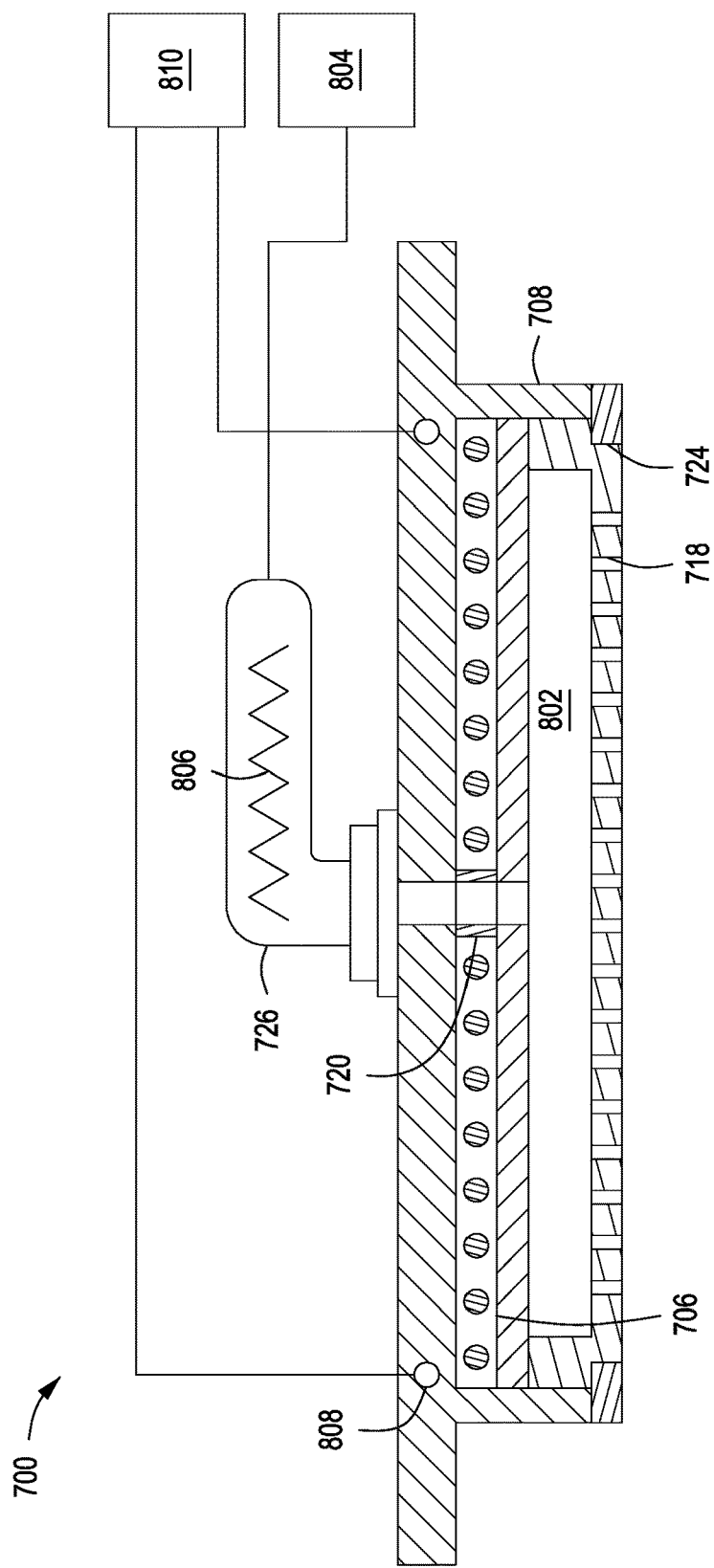
FIG. 8 depicts a sectional view of a showerhead assembly in accordance with some embodiments of the present disclosure.

In some embodiments, the first showerhead may alternatively include a plurality of infrared lamps such as the showerhead assembly depicted in FIGS. 7 and 8. FIGS. 7 and 8 respectively depict exploded isometric and cross-sectional views of a showerhead assembly 700 in accordance with some embodiments of the present disclosure. In some embodiments, the showerhead assembly 700 includes an upper plate 702 having a gas inlet 704 and an interior volume 706 (second interior volume) formed by walls 708 (second walls) extending downward from the upper plate 702. In some embodiments, the upper plate 702 includes a coolant channel 808 formed in the upper plate 702 to prevent heat from being transmitted to a chamber body in which the showerhead assembly 700 is installed. In some embodiments, the coolant channel 808 may be outward of the walls 708. In some embodiments, the coolant channel 808 may alternatively be proximate the walls 708. The coolant channel 808 is coupled to a coolant supply 810 to flow a coolant through the coolant channel 808.

A plurality of infrared lamps 710 are disposed within the interior volume 706. A holding plate 712 is disposed below the plurality of infrared lamps 710 to support the plurality of infrared lamps 710 within the interior volume 706. In some embodiments, the plurality of infrared lamps 710 includes a plurality of heating zones that may be controlled independently or in groups. In some embodiments, the plurality of heating zones includes 1-4 heating zones. Each of the plurality of infrared lamps 710 is configured to reach a temperature between about 170° C. and about 200° C. In some embodiments, each of the plurality of infrared lamps 710 has a voltage of about 110 volts and a power rating of about 700 watts. However, the plurality of infrared lamps 710 may include lamps of other voltages and power ratings to achieve a desired result (i.e., a desired flatness control of a warped substrate). In some embodiments, the plurality of infrared lamps 710 are configured to maintain a warped substrate at a temperature between about 180° C. and about 200° C. The inventors have discovered that by using infrared lamps instead of resistive heating elements, the temperature of the showerhead assembly 700 may advantageously be more rapidly changed when compared with resistive heating elements.

The showerhead assembly 700 further includes a blocker plate 714 is disposed below the holding plate 712. The blocker plate includes a recessed section 716 which, together with the holding plate 712, forms a plenum 802 (FIG. 8). A plurality of apertures 718 are formed through the blocker plate 714 in the recessed section 716. In some embodiments, the blocker plate is formed of a transparent material such as, for example, quartz. A gas conduit 720 extends from the gas inlet 704 through the holding plate 712 to supply gas to the plenum 802.

The showerhead assembly 700 further includes a cover plate 722 disposed below the blocker plate 714. The cover plate 722 includes a central opening 724 corresponding to the recessed section 716 to expose the recessed section 716 and allow gas to flow from the plenum 802, through the plurality of apertures 718, and into a processing volume (e.g., first processing volume 304a) beneath the showerhead assembly. The cover plate 722 is coupled to a bottom of the walls 708 of the upper plate 702 to retain the holding plate and the blocker plate within the interior volume 706. In some embodiments, the cover plate 722 may include a plurality of alignment pins 728 which are inserted into the bottom of the walls 708 to properly align the cover plate 722 with respect to the upper plate 702 during installation. In some embodiments, the cover plate 722 may be formed of a thermally conductive material such, as for example, aluminum, stainless steel, or the like.

In some embodiments, the showerhead assembly 700 further includes a gas supply line 726 coupled to the gas inlet 704 of the upper plate 702. In some embodiments, the gas supply line 726 is coupled to a gas supply 804 to supply an inert gas such as, for example, nitrogen, to the processing volume (e.g., first processing volume 304a. In some embodiments, the gas supply line 726 includes a heater 806 disposed within the gas supply line 726 to heat gas passing through the gas supply line 726 and maintain the gas at a predetermined temperature.

Returning to FIG. 3, a deformed substrate 305a (shown in phantom) may enter the first process chamber 302a via a first opening 309a in a wall of the first process chamber 302a. The first opening 309a may be selectively sealed via a first slit valve 311a, or other mechanism for selectively providing access to the interior of the chamber through the opening. The first substrate support 306a may be coupled to a first lift mechanism 338a (such as a motor or actuator) that may control the position of the first substrate support 306a between a lower position (as shown) suitable for transferring substrates into and out of the chamber via the first opening 309a and a selectable upper position suitable for processing. The process position may be selected to maximize temperature uniformity across the substrate. The first lift mechanism 338a may be coupled to the first process chamber 302a via a first bellows 340a or other flexible vacuum hose to maintain a predetermined pressure range in the first processing volume 304a when the first substrate support 306a is moved.

The first process chamber 302a may further include a first exhaust system 342a for removing excess process gases from the first processing volume 304a of the first process chamber 302a. For example, the first exhaust system 342a may include a vacuum pump coupled to a pumping plenum via a pumping port for pumping out the exhaust gases from the first process chamber 302a, or any suitable exhaust system. For example, the vacuum pump may be fluidly coupled to an exhaust outlet for routing the exhaust to appropriate exhaust handling equipment. A valve (such as a gate valve, z-motion valve, or the like) may be disposed in the pumping plenum to facilitate control of the flow rate of the exhaust gases in combination with the operation of the vacuum pump.

To facilitate control of the first process chamber 302a as described above, a first controller 344a comprises a first central processing unit (CPU) 346a, a first memory 348a, and first support circuits 350a for the first CPU 346a and facilitates control of the components of the first process chamber 302a. The first controller 344a may any form of general-purpose computer processor that can be used in an industrial setting for controlling various chambers and subprocessors. The first memory 348a, or computer-readable medium, of the first CPU 346a may be one or more of readily available memory such as random access memory (RAM), read only memory (ROM), floppy disk, hard disk, or any other form of digital storage, local or remote. The first support circuits 350a are coupled to the first CPU 346a for supporting the processor in a conventional manner. These circuits include cache, power supplies, clock circuits, input/output circuitry and subsystems, and the like. The methods performed in the first process chamber 302a, or at least portions thereof, may be stored in the first memory 348a as a software routine. The software routine may also be stored and/or executed by another CPU (not shown) that is remotely located from the hardware being controlled by the first CPU 346a.

The substrate processing system 300 further includes a second process chamber 302b (i.e., a cooling chamber) having a second processing volume 304b and a second substrate support 306b disposed in the second processing volume 304b for supporting a planarized substrate 305b. The second process chamber 302b is also an atmospheric chamber (i.e., is not a vacuum chamber). A description of components of the second process chamber 302b that are substantially identical to corresponding components of the first process chamber 302a will be omitted for brevity. Only components of the second process chamber 302b will be described.

In some embodiments, the second process chamber 302b may optionally include a second showerhead 319b that is coupled to a second gas panel 321b as to provide one or more process gases to the second processing volume 304b. The one or more process gases may include one or more non-toxic inert gases such as, for example, nitrogen or argon. Alternatively or in combination, the one or more process gases may be delivered to the second processing volume 304b via side injection ports (not shown) disposed about the walls of the second process chamber 302b, or gas inlets disposed in other regions of the process chamber. The second showerhead 319b may include a first plurality of coolant channels 316b to flow a coolant from a first coolant supply 356b to cool the one or more process gases passing through the second showerhead 319b. The first coolant supply 356b may be coupled to a third temperature controller 360b to control the first coolant supply 356b.

The second substrate support 306b includes a second plurality of coolant channels 322b disposed in the second substrate support 306b proximate the second support surface 308b to provide cool the planarized substrate 305b when disposed on the second support surface 308b. The second plurality of coolant channels 322b supply and return lines 324b that extend from the second plurality of coolant channels 322b through the second shaft 310b to provide coolant to the second plurality of coolant channels 322b. The supply and return lines 324b couple the second plurality of coolant channels 322b to a second coolant supply 326b disposed external of the second process chamber 302b. A fourth temperature controller 330b may control the second coolant supply 326b to selectively supply coolant to the second plurality of coolant channels 322b. Alternatively, the fourth temperature controller 330b may be part of, or coupled to, a system controller, such as the controller 344b that may control the operations of the second process chamber 302b. In some embodiments, the second substrate support 306b may include a chucking mechanism (not shown) such as, for example, a vacuum or electrostatic chuck.

A planarized substrate 305b may enter the second process chamber 302b via a second opening 309b in a wall of the second process chamber 302b. The second opening 309b may be selectively sealed via a second slit valve 311b, or other mechanism for selectively providing access to the interior of the chamber through the opening. The second substrate support 306b may also include a lift pin mechanism (not shown) having a plurality of lift pins to facilitate placement and removal of the substrate on/from the second support surface 308b.

To prepare the first process chamber 302a to planarize a warped substrate 305a, a process gas (e.g., one or more inert gases, such as nitrogen or argon) is flowed into the first processing volume 304a through the first showerhead 319a. Subsequently, the first heater 322a is activated to heat the first substrate support 306a to a first predetermined temperature and the second heater 316a is activated to heat the process gas to a second predetermined temperature. The predetermined temperature may be at or above a glass transition temperature of an epoxy disposed on the substrate (for substrates having an epoxy coating). For example, in some embodiments, the first predetermined temperature and the second predetermined temperature are both between about 150° C. to about 220° C. In some embodiments, the first and second predetermined temperatures are both between about 160° C. to about 220° C. Alternatively, the predetermined temperature may be at or slightly above the glass transition temperature of an epoxy disposed on the substrate (for substrates having an epoxy coating). For example, in some embodiments, the first and second predetermined temperatures are both between about 150° C. to about 160° C. In some embodiments, the first and second predetermined temperatures are both about 160° C.

After the first process chamber 302a is at a predetermined operating temperature, a warped substrate 305a (such as a warped substrate having an epoxy coating) is placed on the first support surface 308a of the first substrate support 306a. In some embodiments, the warped substrate 305a is initially at room temperature (e.g., about 21° C.). The warped substrate 305a is rapidly heated to the first predetermined temperature during a first time period. In the embodiment in which the first predetermined temperature is about 150° C. to about 160° C., or about 160° C., the first time period is between about 5 second and about 10 seconds. The warped substrate 305a is then maintained at the first predetermined temperature for a second time period to deform and planarize the warped substrate 305a into the planarized substrate 305b. In the embodiment in which the first predetermined temperature is about 150° C. to about 160° C., or about 160° C., the second time period is between about 10 seconds and about 2 minutes. Subsequently, the second temperature controller 360a changes the power supplied to the second heater 316a by the second power supply 356a to decrease the temperature of the process gas to a third predetermined temperature. In some embodiments, the third predetermined temperature may be between about 25° C. and about 130° C. As a result, the temperature of planarized substrate 305b is gradually decreased at a first cooling rate to a fourth predetermined temperature during a third time period. In some embodiments, the fourth predetermined temperature is below the glass transition temperature for an epoxy coating disposed on the substrate. In some embodiments, the fourth predetermined temperature is about 130° C. and the third time period is between about 30 seconds to about 2 minutes.

After the planarized substrate 305b has reached the fourth predetermined temperature, the planarized substrate 305b is removed from the first process chamber 302a and placed on the second support surface 308b of the second substrate support 306b to rapidly (i.e., between about 5 seconds to about 10 seconds) cool the planarized substrate at a second cooling rate greater than the first cooling rate. The second processing volume 304b is kept at a fifth predetermined temperature so that the planarized substrate 305b is rapidly cooled when placed in the second process chamber 302b. In some embodiments, the fifth predetermined temperature is between about 5° C. and about 21° C. In some embodiments, a first coolant may be flowed through the second plurality of coolant channels 322b to more quickly cool the planarized substrate 305b. In some embodiments, cooled process gas may optionally also be provided to the second processing volume 304b through the second showerhead 319b, which is cooled by a second coolant flowing through the first plurality of coolant channels 316b. After a fourth time period, the planarized substrate 305b reaches the fifth predetermined temperature. In the embodiment in which the fifth predetermined temperature is about 21° C., the fourth time period is between about 5 second and 10 seconds. Subsequently, the planarized substrate 305b is held at the fifth predetermined temperature for a fifth time period to ensure that the substrate will not deform back to a warped shape. In some embodiments, the fifth time period is about 1 minute.

Figure 4:
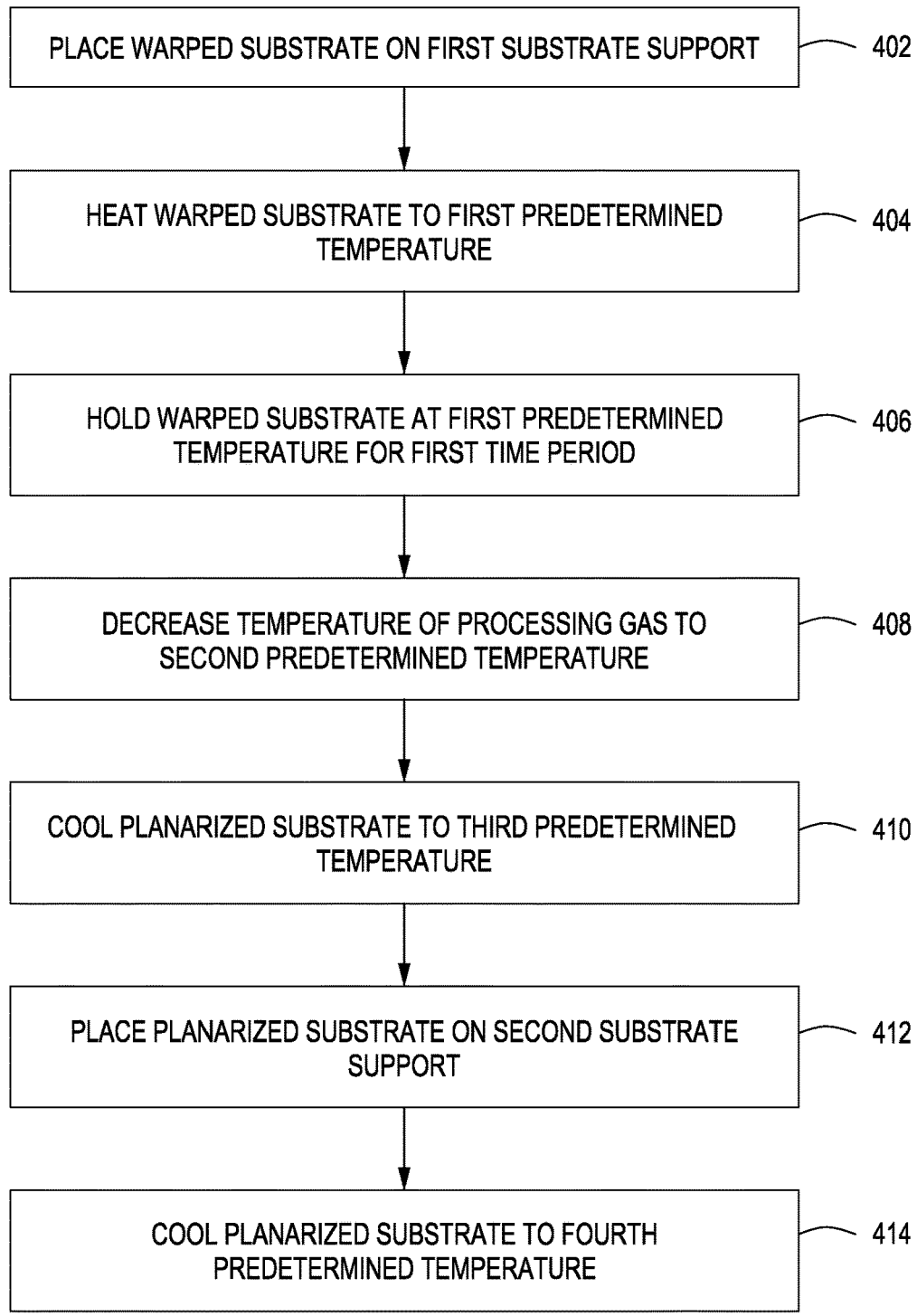
FIG. 4 shows a flow chart illustrating a method for correcting substrate deformity in accordance with some embodiments of the present disclosure.

FIG. 4 is a flowchart illustrating a method 400 for correcting substrate deformity (i.e., flattening a substrate) in accordance with some embodiments of the present disclosure. At 402, a warped substrate 305a is placed on the first substrate support. At 404, the warped substrate 305a is rapidly (i.e., within about 5 second to about 10 seconds) heated to a first predetermined temperature. In some embodiments, the first predetermined temperature is between about 150° C. and about 220° C. In some embodiments, the first predetermined temperature is between about 160° C. and about 220° C. In some embodiments, the first predetermined temperature is between about 150° C. and about 160° C. In some embodiments, the first predetermined temperature is about 160° C. At 406, the warped substrate 305a is held at the first predetermined temperature for a first time period, during which the substrate deforms and becomes planarized. In the embodiment in which the first predetermined temperature is about 150° C. to about 160° C., or about 160° C., the first time period is about 10 seconds to about 2 minutes, or about 2 minutes.

At 408, a temperature of the processing gas entering the first process chamber 302a is decreased to a second predetermined temperature. In some embodiments, the second predetermined temperature is between about 25° C. and about 130° C. At 410, the planarized substrate 305b is cooled to a third predetermined temperature less than the first predetermined temperature at a first cooling rate due to the decrease in the temperature of the process gas. In some embodiments, the third predetermined temperature is about 130° C. At 412, the planarized substrate 305b is placed on a second substrate support 306b of a second process chamber 302b. At 414, the planarized substrate 305b is cooled to a fourth predetermined temperature less than the third predetermined temperature at a second cooling rate greater than the first cooling rate. In some embodiments, the fourth predetermined temperature is about 21° C.

While the foregoing is directed to embodiments of the present disclosure, other and further embodiments of the disclosure may be devised without departing from the basic scope thereof.

The invention claimed is:

1. A substrate support, comprising:
a base having an interior volume formed by walls extending upward from the base, wherein the walls are disposed within a periphery of the base;
a plurality of infrared lamps disposed within the interior volume;
a support plate disposed above the plurality of infrared lamps, wherein the support plate includes a support surface to support a substrate; and
a cover plate disposed atop the support plate and having a central opening corresponding to the support surface and an exhaust portion at a periphery of a top surface of the cover plate, wherein the exhaust portion includes a plurality of perforations fluidly coupling a space above the cover plate with an exhaust conduit formed in the cover plate.

2. The substrate support of claim 1, wherein the support plate comprises:
a through hole disposed proximate a center of the support plate; and
a plurality of channels extending outward from the through hole, wherein the through hole and the plurality of channels are configured to distribute a vacuum chucking force over a bottom surface of the substrate.

3. The substrate support of claim 1, wherein the plurality of infrared lamps include between 1 and 4 heating zones.

4. The substrate support of claim 1, wherein the base includes a coolant channel formed in the base.

5. The substrate support of claim 1, wherein the support plate is formed of quartz.

6. The substrate support of claim 1, wherein the cover plate is formed of aluminum or stainless steel.

7. The substrate support of claim 1, further comprising:
a lift pin assembly having a plurality of lift pins,
wherein the base includes a first plurality of holes corresponding to the plurality of lift pins, wherein the support plate includes a second plurality of holes corresponding to first plurality of holes and aligned with the first plurality of holes so that the plurality of lift pins extend through the first and second plurality of holes when the lift pin assembly is in a raised position.

8. A showerhead assembly, comprising:
an upper plate having a gas inlet and an interior volume formed by walls extending downward from the upper plate, wherein the walls are disposed within a periphery of the upper plate;
a plurality of infrared lamps disposed within the interior volume;
a holding plate disposed below the plurality of infrared lamps to support the plurality of infrared lamps within the interior volume;
a blocker plate having a plurality of apertures and disposed below the holding plate, wherein the blocker plate includes a recessed section which, together with the holding plate, forms a plenum, and wherein the plurality of apertures are disposed in the recessed section;
a gas conduit extending from the gas inlet and through the holding plate to supply gas to the plenum; and
a cover plate disposed below the blocker plate and having a central opening corresponding to the recessed section, wherein the cover plate is coupled to a top of the walls of the upper plate to couple the holding plate and the blocker plate to the upper plate.

9. The showerhead assembly of claim 8, further comprising:
a gas supply line coupled to the gas inlet, wherein the gas supply line includes a heater configured to heat gas passing through the gas supply line.

10. The showerhead assembly of claim 8, wherein the plurality of infrared lamps include between 1 and 4 heating zones.

11. The showerhead assembly of claim 8, wherein the upper plate includes a coolant channel formed in the upper plate.

12. The showerhead assembly of claim 8, wherein the blocker plate is formed of quartz.

13. The showerhead assembly of claim 8, wherein the cover plate is formed of aluminum or stainless steel.

14. A process chamber, comprising:
a chamber body having a processing volume;
a substrate support disposed in a lower portion of the processing volume, the substrate support comprising:
 a base having a first interior volume formed by first walls extending upward from the base, wherein the first walls are disposed within a periphery of the base;
 a first plurality of infrared lamps disposed within the first interior volume;
 a support plate disposed above the first plurality of infrared lamps, wherein the support plate includes a support surface to support a substrate; and
 a first cover plate disposed atop the support plate and having a first central opening corresponding to the support surface and an exhaust portion at a periphery of a top surface of the first cover plate, wherein the exhaust portion includes a plurality of perforations fluidly coupling the processing volume with an exhaust conduit formed in the first cover plate; and
a showerhead assembly disposed in an upper portion of the processing volume opposite the substrate support, the showerhead assembly comprising:
 an upper plate having a gas inlet and a second interior volume formed by second walls extending downward from the upper plate, wherein the second walls are disposed within a periphery of the upper plate;
 a second plurality of infrared lamps disposed within the second interior volume;
 a holding plate disposed below the second plurality of infrared lamps to support the second plurality of infrared lamps within the second interior volume;
 a blocker plate having a plurality of apertures and disposed below the holding plate, wherein the blocker plate includes a recessed section which, together with the holding plate, forms a plenum, and wherein the plurality of apertures are disposed in the recessed section;
 a gas conduit extending from the gas inlet and through the holding plate to supply gas to the plenum; and
 a second cover plate disposed below the blocker plate and having a second central opening corresponding to the recessed section, wherein the second cover plate is coupled to a top of the second walls of the upper plate to couple the holding plate and the blocker plate to the upper plate.

15. The process chamber of claim 14, further comprising:
a first power supply electrically coupled to the first plurality of infrared lamps;
a first temperature controller coupled to the first power supply to control the first power supply;
a second power supply electrically coupled to the second plurality of infrared lamps; and
a second temperature controller coupled to the second power supply to control the second power supply.

16. The process chamber of claim 14, further comprising:
a vacuum chucking supply,
wherein the substrate support further comprises:
 a through hole disposed proximate a center of the support plate and fluidly coupled to the vacuum chucking supply; and
 a plurality of channels extending outward from the through hole, wherein the through hole and the plurality of channels are configured to distribute a vacuum chucking force over a bottom surface of the substrate.

17. The process chamber of claim 14, wherein the base includes a first coolant channel formed in the base, and wherein the upper plate includes a second coolant channel formed in the upper plate.

18. The process chamber of claim 14, wherein the substrate support further comprises:
a lift pin assembly having a plurality of lift pins,
wherein the base includes a first plurality of holes corresponding to the plurality of lift pins, wherein the support plate includes a second plurality of holes corresponding to first plurality of holes and aligned with the first plurality of holes so that the plurality of lift pins extend through the first and second plurality of holes when the lift pin assembly is in a raised position.

19. The process chamber of claim 14, wherein the showerhead assembly further comprises:
a gas supply line coupled to the gas inlet, wherein the gas supply line includes a heater configured to heat gas passing through the gas supply line.

20. The process chamber of claim 14, wherein the first and second plurality of infrared lamps include between 1 and 4 heating zones.

* * * * *